US012740027B2

(12) United States Patent
Zheng et al.

(10) Patent No.: US 12,740,027 B2
(45) Date of Patent: Sep. 15, 2026

(54) POWER ELEMENT ASSEMBLY STRUCTURE

(71) Applicant: Delta Electronics (Shanghai) Co., Ltd., Shanghai (CN)

(72) Inventors: Qunbo Zheng, Shanghai (CN); Linfeng Zhong, Shanghai (CN); Junhao Xia, Shanghai (CN); Tengshen Zhang, Shanghai (CN); Jinfa Zhang, Shanghai (CN); Yuanyuan Song, Shanghai (CN)

(73) Assignee: Delta Electronics (Shanghai) Co., Ltd., Shanghai (CN)

(*) Notice: Subject to any disclaimer, the term of this patent is extended or adjusted under 35 U.S.C. 154(b) by 252 days.

(21) Appl. No.: 18/642,833

(22) Filed: Apr. 23, 2024

(65) Prior Publication Data

US 2024/0357778 A1 Oct. 24, 2024

(30) Foreign Application Priority Data

Apr. 24, 2023 (CN) ......................... 202310450906.2

(51) Int. Cl.
*H05K 7/20* (2006.01)
*H05K 1/18* (2026.01)

(52) U.S. Cl.
CPC ............... *H05K 7/209* (2013.01); *H05K 1/18* (2013.01)

(58) Field of Classification Search
CPC H05K 7/209; H05K 5/03; H05K 5/04; H05K 7/20472; H05K 7/2049; H05K 7/20854; H05K 1/18; H01H 9/52
See application file for complete search history.

(56) References Cited

U.S. PATENT DOCUMENTS 4,707,726 A * 11/1987 Tinder ................ H10W 40/611 257/796
4,972,294 A * 11/1990 Moses, Jr. ........... H10W 40/641 174/16.3

(Continued)

FOREIGN PATENT DOCUMENTS

CN 201608173 U 10/2010
CN 202487561 U 10/2012

(Continued)

OTHER PUBLICATIONS

Lin, Cong-kai, Radiating Stucture and Using Method Thereof, Jun. 27, 2012, CN-101511159-B, PE2E Search Translation (Year: 2012).*

(Continued)

*Primary Examiner* — Michael A Matey
(74) *Attorney, Agent, or Firm* — CKC & Partners Co., LLC

(57) ABSTRACT

Provided is a power element assembly structure, including a main board, a first heat sink, a second heat sink, an insulating support, a power element, an insulating thermally conductive layer, and a fixture; where a first end of the insulating support is connected to the main board, a second end of the insulating support is connected to a bottom surface of the first heat sink, and there is a distance between the first heat sink and the main board, a top surface of the first heat sink is connected to the second heat sink; and the insulating thermally conductive layer is attached to a lateral surface of the first heat sink, the power element is attached to the insulating thermally conductive layer, and is fixed to the first heat sink by the fixture, and the power element is plugged on the main board.

8 Claims, 3 Drawing Sheets

(56) References Cited

U.S. PATENT DOCUMENTS 5,172,756 A * 12/1992 Jayamanne ......... H10W 40/611 361/720
5,191,512 A * 3/1993 Ogura ................. H10W 40/611 361/720
5,225,965 A * 7/1993 Bailey ................. H10W 40/641 174/16.3
5,309,979 A * 5/1994 Brauer ................ H10W 40/641 174/16.3
5,321,582 A * 6/1994 Casperson ........... H05K 7/2049 361/705
5,450,284 A * 9/1995 Wekell ................ H10W 40/611 257/725
5,909,358 A * 6/1999 Bradt .................. H10W 40/641 257/726
6,075,703 A * 6/2000 Lee ..................... H10W 40/641 174/16.3
6,222,732 B1 * 4/2001 Jakob ..................... H05K 7/209 361/720
6,587,344 B1 * 7/2003 Ross ................... H10W 40/037 165/185
6,740,968 B2 * 5/2004 Matsukura .......... H10W 40/611 257/E23.087
6,753,603 B2 * 6/2004 Segi ..................... H05K 1/0209 257/E23.101
7,021,365 B2 * 4/2006 Rearick ............... H10W 40/641 165/80.2
7,750,252 B2 * 7/2010 Colby ................... H10W 40/00 257/722
7,778,036 B2 * 8/2010 Kontani ............... H05K 7/2049 257/718
11,520,391 B1 * 12/2022 Lu ......................... H05K 7/209
11,925,007 B2 * 3/2024 Jung .................. H05K 7/20472
2002/0006027 A1 * 1/2002 Rodriguez ......... H05K 7/20909 361/688
2002/0145854 A1 * 10/2002 Lin ....................... H10W 40/22 174/16.3
2003/0117774 A1 * 6/2003 Privett ................... H05K 7/209 361/704
2003/0206392 A1 * 11/2003 Kawata .................. H05K 7/209 361/631
2004/0085737 A1 * 5/2004 Choi ................... H10W 40/611 257/E23.084
2005/0264998 A1 * 12/2005 McCutcheon ...... H10W 40/611 257/E23.084
2007/0025087 A1 * 2/2007 Chen ...................... H05K 7/209 361/704
2008/0055862 A1 * 3/2008 Yu ....................... H10W 40/611 257/E23.084
2013/0258603 A1 * 10/2013 Pan ..................... H10W 40/611 361/717
2017/0055364 A1 2/2017 Fung
2020/0091033 A1 * 3/2020 Kobayashi .......... H10W 40/641
2022/0209513 A1 * 6/2022 Jung .................. H05K 7/20472

FOREIGN PATENT DOCUMENTS

CN 107197607 A 9/2017
CN 207664042 U 7/2018
CN 110265367 A 9/2019
CN 209627987 U 11/2019
CN 214125853 U 9/2021
CN 113795079 A 12/2021
CN 216795545 U 6/2022

OTHER PUBLICATIONS

Shen, Guo-qiao, Radiating Device and Power Module for the High Voltage Power Device, Jul. 27, 2018, CN-207664042-U, PE2E Search Translation (Year: 2018).*
Chen, Jian-Sheng, Radiating Structure, Radiating System and Electronic Equipment, Jun. 21, 2022, CN-216795545-U, PE2E Search Translation (Year: 2022).*
The Office Action of corresponding Chinese application No. 202310450906.2, dated Dec. 29, 2025.

* cited by examiner

POWER ELEMENT ASSEMBLY STRUCTURE

CROSS-REFERENCE TO RELATED APPLICATION

This application claims priority to Chinese Patent Application No. 202310450906.2, filed on Apr. 24, 2023, which is hereby incorporated by reference in its entirety.

TECHNICAL FIELD

Embodiments of the present application belong to the field of power electronics, and in particular, relate to a power element assembly structure.

BACKGROUND

With the development of power electronics technologies, power elements are widely used in high-power converters and other apparatuses. Due to large power consumption of the power element, heat generated by the power element is relatively large. In order to prevent the heat from damaging the power element, it is necessary to dissipate heat from the power element.

In related art, a power element assembly structure usually includes a main board, a heat sink and a power element. The power element is plugged into the main board. The heat sink is connected with the power element, and is welded on the main board to dissipate heat from the power element.

However, in the power element assembly structure in related art, the layout flexibility of the main board is low, the area of the main board is large, and the heat dissipation capability is poor.

SUMMARY

In view of this, embodiments of the present application provide a power element assembly structure to solve at least one defect in the prior art.

An embodiment of the present application provides a power element assembly structure, including a main board, a first heat sink, a second heat sink, an insulating support, a power element, an insulating thermally conductive layer, and a fixture; where a first end of the insulating support is connected to the main board, a second end of the insulating support is connected to a bottom surface of the first heat sink, and there is a distance between the first heat sink and the main board, a top surface of the first heat sink is connected to the second heat sink; and the insulating thermally conductive layer is attached to a lateral surface of the first heat sink, the power element is attached to the insulating thermally conductive layer, and is fixed to the first heat sink by the fixture, and the power element is plugged into the main board.

In the power element assembly structure of the embodiment of the present application, heat generated by the power element during operation is transferred to the second heat sink through the first heat sink, to dissipate heat from the power element. Because there is a distance between the first heat sink and the main board, compared with the first heat sink welded on the main board, a safety distance required by the first heat sink is reduced, so that the first heat sink and the power element can be arranged at a plurality of positions on the main board. Therefore, layout flexibility of the main board is improved, the area of the main board can be reduced, and heat dissipation capability of the main board can be improved, which is beneficial to the miniaturization of the power element assembly structure.

In some implementations that may include the above-mentioned embodiments, the fixture is an elastic sheet, the elastic sheet is connected to the first heat sink, and the power element is crimped to the first heat sink.

In some implementations that may include the above-mentioned embodiments, the power element assembly structure further comprises an insulating sheet, the insulating sheet is located between the fixture and the power element, and the insulating sheet is crimped on the power element by the fixture.

In some implementations that may include the above-mentioned embodiments, a screw hole is provided on the lateral surface of the first heat sink; both the fixture and the insulating sheet have through holes, and the fixture and the insulating sheet are connected to the first heat sink through a connecting bolt passing through the through holes.

In some implementations that may include the above-mentioned embodiments, two protecting portions are respectively provided on both sides of the insulating sheet, both of the two protecting portions are connected to the insulating sheet, the two protecting portions and the insulating sheet are surrounded to form a protecting cavity, wherein the protecting cavity is provided on the power element.

In some implementations that may include the above-mentioned embodiments, the insulating support is an insulating support column.

In some implementations that may include the above-mentioned embodiments, a first end of the insulating support column is connected to the main board, and a second end of the insulating support column is provided with a connecting protrusion; the first heat sink is provided with a third through hole, and the third through hole is sleeved on the connecting protrusion.

In some implementations that may include the above-mentioned embodiments, a thermal conductive material is arranged between the first heat sink and the second heat sink; the thermal conductive material is arranged between the insulating thermally conductive layer and the first heat sink.

In some implementations that may include the above-mentioned embodiments, the power element assembly structure comprises a plurality of the first heat sinks, and part or all of the first heat sinks in the power element assembly structure are surrounded to form a heat dissipation channel.

In some implementations that may include the above-mentioned embodiments, top surfaces of the plurality of first heat sinks are aligned.

BRIEF DESCRIPTION OF DRAWINGS

In order to describe the embodiments of the present disclosure or the technical solutions in the prior art more clearly, in the following, drawings that need to be used in the description of the embodiments or prior art will be introduced briefly. Apparently, the accompanying drawings in the following description are some embodiments of the present application, and for those of skilled in the art, other drawings can be obtained based on these drawings without paying creative efforts.

EXPLANATION OF REFERENCE SIGNS

Figure 1:
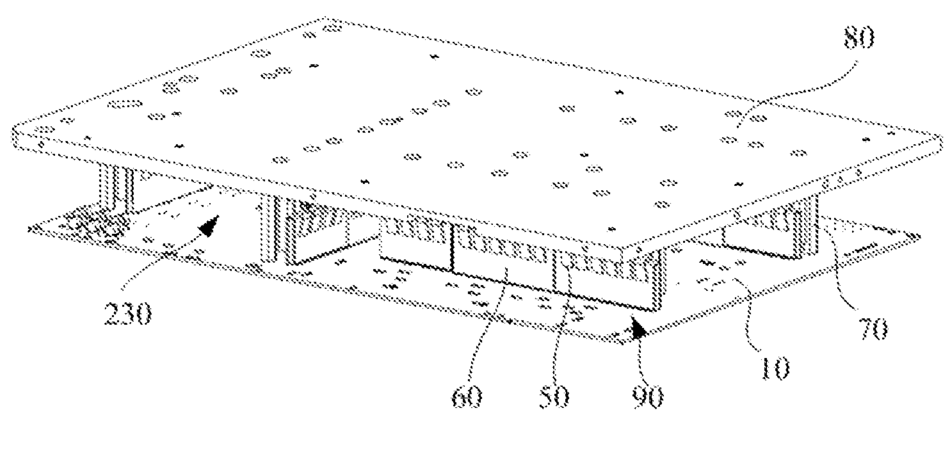
FIG. 1 is a schematic structural diagram of a power element assembly structure according to an embodiment of the present application.

10—Main board;
  110—Third screw hole;
20—First heat sink;
  210—First heat dissipation plate; 211—Third through hole;
  212—Bottom surface; 213—Top surface;
  220—Second heat dissipation plate; 221—Lateral surface;
  222—Second screw hole; 230—Heat dissipation channel;
30—Power element;
40—Insulating thermally conductive layer;
50—Fixture;
  510—First connecting portion; 511—First through hole;
  520—Second connecting portion; 530—Crimping portion;
60—Insulating sheet;
  610—Second through hole; 620—Protecting portion;
70—Insulating support;
  710—Connecting protrusion;
80—Second heat sink;
90—Assembly module.

DESCRIPTION OF EMBODIMENTS

The power element assembly structure in the related art has the technical problem that an area of a main board increases caused by layout flexibility of the main board being low. The research of inventors found that the reason is that in the power element assembly structure in the related art, a heat sink is connected with the power element and is welded on the main board. Since the heat sink is welded on the main board, a certain safety distance needs to be reserved for the heat sink. Therefore, installation positions of the heat sink and the power component are limited by positions of other elements on the main board, which reduces the layout flexibility of the main board. In order to meet the safety distance requirement of the heat sink, the area of the main board needs to be increased.

In view of this, an embodiment of the present application provides a power element assembly structure, which is provided with a first heat sink, an insulating support and a second heat sink, where the first heat sink is connected to the main board through the insulating support, and there is a distance between the first heat sink and the main board. The power element is fixed on a lateral surface of the first heat sink and plugged into the main board. The second heat sink is connected to a top surface of the first heat sink. Heat generated by the power element during operation is transferred to the second heat sink through the first heat sink, to dissipate heat from the power element. Because there is a distance between the first heat sink and the main board, compared with the first heat sink welded on the main board, a safety distance required by the first heat sink is reduced, so that the first heat sink and the power element can be arranged at a plurality of positions on the main board. Therefore, layout flexibility of the main board is improved, the area of the main board can be reduced, and heat dissipation capability of the main board can be improved, which is beneficial to the miniaturization of the power element assembly structure.

In order to make the purpose, technical solutions and advantages of embodiments of the present application clearer, the technical solutions in the embodiments of the present application will be described as follows clearly and completely in conjunction with accompanying drawings in the embodiments of the present application. Apparently, the described embodiments are a part rather than all of the embodiments of the present application. Based on the embodiments in the present application, all other embodiments obtained by those of ordinary skill in the art without paying creative work shall fall within the protection scope of the present application.

Referring to FIG. 1, FIG. 2, FIG. 3, FIG. 4 and FIG. 5, an embodiment of the present application provides a power element assembly structure, including a main board 10, a first heat sink 20, a second heat sink 80, an insulating support 70, a power element 30, an insulating thermally conductive layer 40 and a fixture 50. A first end of the insulating support 70 is connected to the main board 10, a second end of the insulating support 70 is connected to a bottom surface 212 of the first heat sink 20, and there is a distance H between the first heat sink 20 and the main board 10, a top surface 213 of the first heat sink 20 is connected to the second heat sink 80. The insulating thermally conductive layer 40 is attached to the lateral surface 221 of the first heat sink 20, and the power element 30 is attached to the insulating thermally conductive layer 40. The power element 30 is fixed on the first heat sink 20 by the fixture 50. The power element 30 is plugged into the main board 10.

In the power element assembly structure of the embodiment of the present application, heat generated by the power element 30 during operation can be transferred to the first heat sink 20 through the insulating thermally conducting layer 40, and then transferred to the second heat sink 80, to dissipate heat from the power element 30. Since there is a distance H between the first heat sink 20 and the main board, the first heat sink 20 and the main board 10 are separated from each other. Compared with the heat sink welded on the main board in the related art, the power element assembly structure of the embodiment of the present application reduces a safety distance required by the first heat sink 20, so that the first heat sink 20 and the power element 30 can be arranged at a plurality of positions on the main board 10. Therefore, layout flexibility of the main board 10 is improved, and the area of the main board 10 can be reduced, which is beneficial to the miniaturization of the power element assembly structure.

Moreover, the heat generated by the power element 30 during operation can be transferred to the first heat sink 20 through the insulating thermally conductive layer 40, and then transferred to the second heat sink 80 for heat dissipation. The second heat sink 80 can increase an area for heat dissipation for the power element 30, to enhance the heat dissipation effect, to further prevent heat from damaging the power element 30, which improves reliability of the power element 30. Because the second heat sink 80 is connected to the top surface 213 of the first heat sink 20, that is, the second heat sink 80 is connected to a side of the first heat sink 20 facing away from the main board 10, disassembly between the second heat sink 80 and the first heat sink 20 is more convenient, thus improving replaceability of the second heat sink 80.

In addition, in the power element assembly structure of the embodiment of the present application, the first heat sink 20, the power element 30, the insulating thermally conductive layer 40 and the fixture 50 can be assembled to form an assembly module 90 in advance. A first end of the insulating support 70 is connected to the main board 10. The assembly module 90 is connected to a second end of the insulating support 70. The second heat sink 80 is connected to the top surface 213 of the first heat sink 20. Such arrangement can improve assembly accuracy and assembly convenience of the power element assembly structure.

When the assembly module 90 is connected to the second end of the insulating support 70, pins of the power element 30 can be directly plugged into the main board 10, which improves convenience of alignment between the pins of the power element 30 and the main board 10. The pins of the power element 30 can be connected to the main board 10 without bending, so that the pins of the power element 30 do not need to continuously bear the bending stress, thereby avoiding the problem of poor connection between the power element 30 and the main board 10 due to the continuous bending stress, and improving reliability of the connection between the power element 30 and the main board 10.

Figure 2:
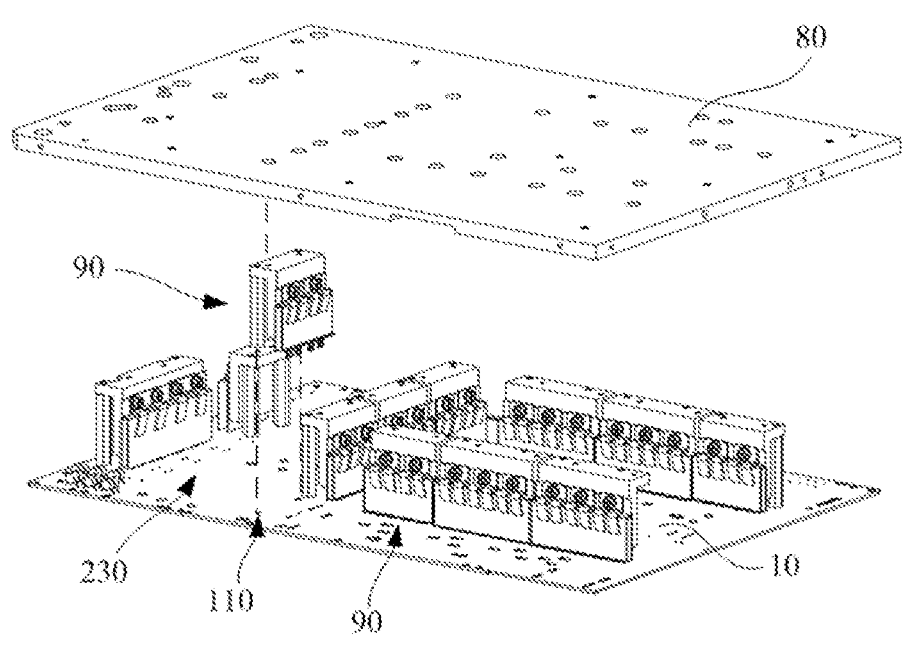
FIG. 2 is a schematic explosion structural diagram of the power component assembly structure in FIG. 1.

Referring to FIG. 1 and FIG. 2, the main board 10 is configured to provide support for other components of the power element assembly structure. A main circuit may be arranged in the main board 10. The main board 10 is provided with a socket hole, and the socket hole corresponds to a specific position of the main circuit. When the power element 30 is plugged into the socket hole of the main board 10, the main circuit in the main board 10 is electrically connected to the power element 30 to form at least part of a functional circuit. The functional circuit refers to a circuit with a specific function. For example, the functional circuit may realize a function of high power conversion, and may also realize other functions, which will not be repeated in the embodiment of the present application.

The first heat sink 20 is configured to dissipate heat from the power element 30. Illustratively, referring to FIG. 4 and FIG. 5, the first heat sink 20 may include a first heat dissipation plate 210 and a second heat dissipation plate 220 which are connected with each other. The first heat dissipation plate 210 is parallel to the main board 10. The first heat dissipation plate 210 may be provided with a third through hole 211, and an axis of the third through hole 211 is perpendicular to the main board 10. The third through hole 211 is configured to connect with the insulating support 70. A surface of the first heat dissipation plate 210 facing the main board 10 is the bottom surface 212 of the first heat sink 20, and a surface of the first heat dissipation plate 210 facing away from the main board 10 is the top surface 213 of the first heat sink 20. The second heat dissipation plate 220 is perpendicular to the first heat dissipation plate 210, and the first end of the second heat dissipation plate 220 is connected to the first heat dissipation plate 210. Illustratively, the first end of the second heat dissipation plate 220 and the first heat dissipation plate 210 may be connected by welding. Alternatively, the second heat dissipation plate 220 and the first heat dissipation plate 210 may also be of an integral structure, so that connection strength between the second heat dissipation plate 220 and the first heat dissipation plate 210 can be improved, and convenience of a manufacture process of the first heat sink 20 can be improved.

There is a distance H between the second end of the second heat sink 220 and the main board 10, so that the first heat sink 20 and the main board 10 are separated from each other. Compared with the heat sink welded on the main board in the related art, the safety distance required by the first heat sink 20 in the embodiment of the present application is smaller, which reduces the restriction on the installation position of the first heat sink 20. Therefore, the layout flexibility of the main board 10 is improved, and the area of the main board 10 can be reduced, which is beneficial to the miniaturization of the power element assembly structure.

The surface of the second heat sink 220 facing away from the insulating support 70 is the lateral surface 221 of the first heat sink 20. The power element 30 is connected to the lateral surface 221, and the power element 30 is plugged on the main board 10 to be electrically connected to the main circuit in the main board 10.

Figure 5:
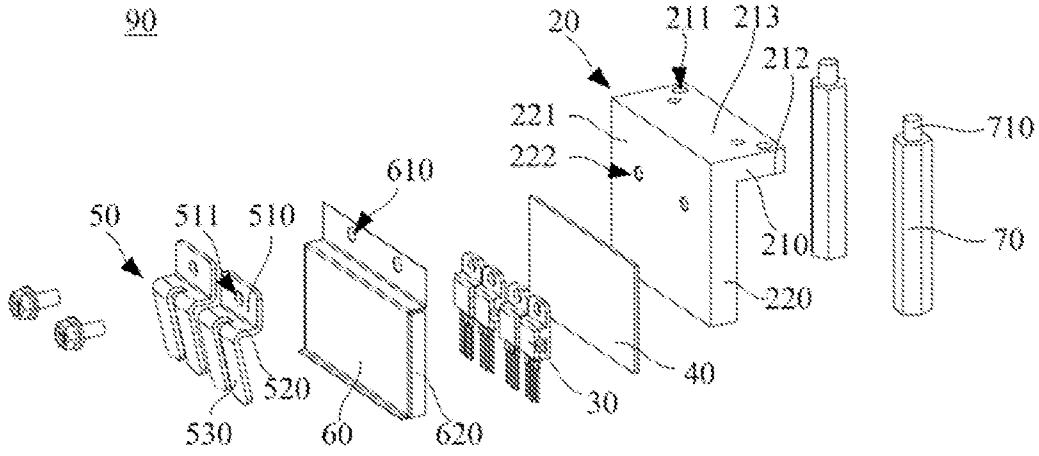
FIG. 5 is a schematic explosion structural diagram of the assembly module in FIG. 4.

For example, referring to FIG. 5, an insulating thermally conductive layer 40 may be provided between the power element 30 and the lateral surface 221. The insulating thermally conductive layer 40 can insulate the power element 30, to protect the power element 30. At the same time, the insulating thermally conductive layer 40 can also transfer the heat of the power element 30 to the lateral surface 221, and then dissipate the heat from the power element 30 through the first heat sink 20.

Illustratively, the insulating thermally conductive layer 40 may be a ceramic wafer. It can be understood that the insulating and heat-conducting layer 40 can also made of other materials with insulating and heat-conducting properties, which will not be repeated in the embodiment of the present application.

The power assembly structure may further include a fixture 50, and the fixture 50 connects the power element 30 to the lateral surface 221 of the first heat sink 20.

Illustratively, the fixture 50 may be a connecting bolt. The power element 30 may be provided with a connecting through hole, and the lateral surface 221 of the first heat sink 20 may be provided with a first screw hole. The connecting bolt can pass through the connecting through hole and be screwed into the first screw hole, to fix the first heat sink 20 to the lateral surface 221 of the first heat sink 20.

Illustratively, the fixture 50 may also be an elastic sheet. The elastic sheet is connected to the first heat sink 20 and crimps the power element 30 to the first heat sink 20. Compared with directly connecting the power element 30 to the lateral surface 221 of the first heat sink 20 by the connecting bolt, the elastic sheet has a greater pressing force on the first heat sink 20. When the power assembly structure is impacted or vibrated, the elastic sheet can still apply a large pressing force on the power element 30, to make the power element 30 be in close contact with the insulating thermally conductive layer 40 and the first heat sink 20, thereby ensuring the heat dissipation effect of the power element 30.

Figure 4:
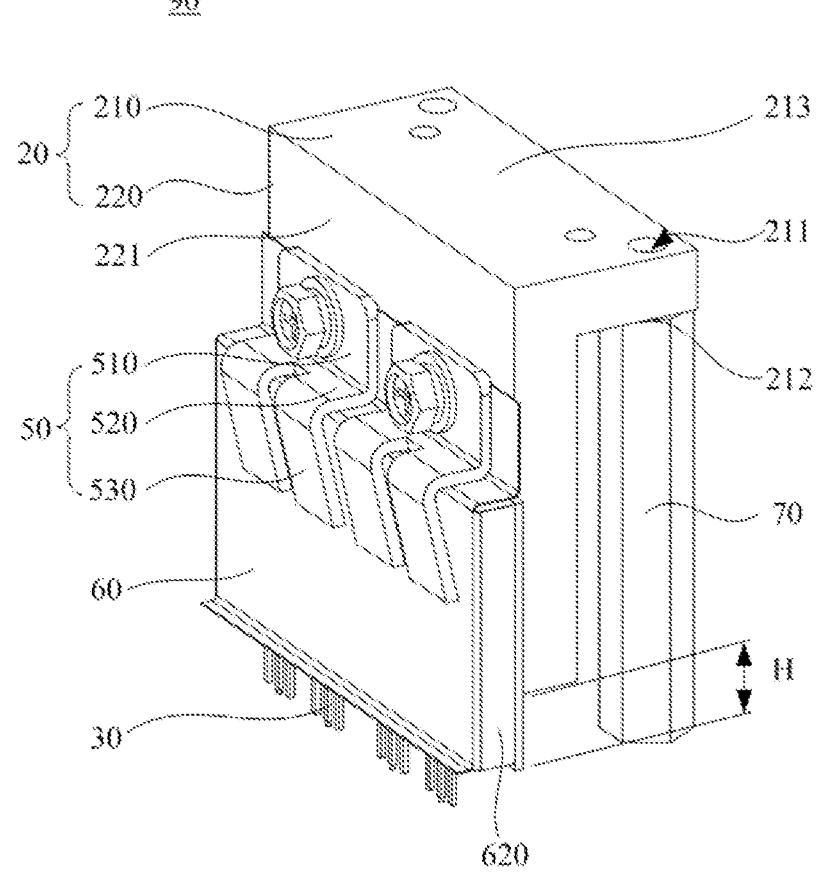
FIG. 4 is a schematic structural diagram of an assembly module formed by a first heat sink, an insulating support, a fixture and an insulating sheet in FIG. 1.

Illustratively, referring to FIG. 4 and FIG. 5, the fixture 50 may include a first connecting portion 510, a second connecting portion 520 and a crimping portion 530. The first connecting portion 510 can be parallel to the second heat dissipation plate 220 and be configured to connect with the second heat dissipation plate 220. A first end of the second connecting portion 520 is connected to the first connecting portion 510. The crimping portion 530 is located on the side of the power element 30 facing away from the second heat sink 220. The crimping portion 530 has a connecting end and a crimping end, where the connecting end is connected to the second end of the second connecting portion 520, and the crimping end crimps the power element 30 onto the second heat sink 220.

Illustratively, a distance between the crimping end of the crimping portion 530 and the second heat sink 220 is smaller than a distance between the connecting end of the crimping portion 530 and the second heat sink 220. That is, as shown in FIG. 4, the crimping portion 530 is disposed obliquely relative to the second heat dissipation plate 220. When the power element 30 is located between the crimping portion 530 and the second heat sink 220, the crimping end of the crimping portion 530 can be moved away from the second heat sink 220, so that the crimping portion 530 is deformed. The crimping part 530 of the power element 30 applies a compressive force to the power element 30 to crimp the power element 30 on the insulating heat conducting layer 40 and the second heat dissipation plate 220, thereby ensuring the contact area between the power element 30 and the insulating thermally conductive layer 40, as well as the first heat sink 20, to ensure the heat dissipation effect of the power element 30.

Illustratively, there may be at least two crimping portions 530, and the at least two crimping portions 530 are arranged at intervals along a direction parallel to the second heat dissipation plate 220. There may also a plurality of power elements 30, and the plurality of power elements 30 may be arranged in one-to-one correspondence with a plurality of crimping portions 530, and each crimping portion 530 crimps the corresponding power element 30 on the first heat sink 20, so that the fixture 50 can simultaneously fix the plurality of power elements 30, which simplifies a mechanical structure of the power element assembly structure and improves compactness of the mechanical structure.

Referring to FIG. 4 and FIG. 5, the power element assembly structure may further include an insulating sheet 60, where the insulating sheet 60 is located between the fixture 50 and the power element 30, and the insulating sheet 60 is crimped on the power element 30 by the fixture 50. The insulating sheet 60 is configured to insulate the power element 30, to protect the power element 30.

Illustratively, a second screw hole 222 is provided on the lateral surface 221 of the first heat sink 20. For example, the second heat sink 220 may be provided with a second screw hole 222. Both the fixture 50 and the insulating sheet 60 may have through holes, and the fixture 50 and the insulating sheet 60 are connected to the first heat sink 20 through a connecting bolt passing through the through holes. For example, the first connecting portion 510 of the fixture 50 may be provided with a first through hole 511. The insulating sheet 60 is provided with a second through hole 610, and the second through hole 610 is opposite to the first through hole 511. The connecting bolt can pass through the second through hole 610 and the first through hole 511, and be screwed into the second screw hole 222, to connect the fixture 50 and the insulating sheet 60 to the lateral surface 221 of the first heat sink 20.

Illustratively, two protecting portions 620 can be respectively provided on both sides of the insulating sheet 60, both of the two protecting portions 620 are connected to the insulating sheet 60, and the two protecting portions 620 and the insulating sheet 60 are surrounded to form a protecting cavity, where the protecting cavity is provided to cover the power element 30. With such arrangement, the protecting cavity can provide all-round insulation protection for the power element 30, thereby improving the reliability of the power element 30.

Illustratively, the insulating sheet 60 may be a Mylar sheet. The material of the insulating sheet 60 may also be nylon, polycarbonate (PC), etc., or other insulating materials, which will not be repeated in the embodiment of the present application.

Referring to FIG. 2 to FIG. 5, an insulating support 70 may also be connected to the main board 10. The main board 10 may be provided with a third screw hole 110 configured to connect with the insulating support 70. Illustratively, the insulating support 70 may be a block structure. The insulating support 70 may also be a column structure. For example, the insulating support 70 is an insulating support column. The end surface of the insulating support column is small, which can reduce the layout space occupied by the main board 10, thereby improving the layout flexibility of the main board 10.

The first end of the insulating support column can be provided with an external screw, to be screwed into the third screw hole 110. The second end of the insulating support column may be provided with a connecting protrusion 710. The connecting protrusion 710 is configured to connect with the first heat sink 20. A third through hole 211 may be disposed on the first heat sink 20. For example, the third through hole 211 may be disposed on the first heat dissipation plate 210. The third through hole 211 is sleeved on the connecting protrusion 710, and the connecting protrusion 710 can position the first heat sink 20 in the direction parallel to the main board 10 through the third through hole 211, which improves the position accuracy of the first heat sink 20 and the power element 30 connected to the first heat sink 20. In addition, the connection protrusion 710 can also guide the first heat sink 20 in a direction perpendicular to the main board 10 through the third through hole 211, to facilitate subsequent adjustment of the positions of the first heat sink 20 and the power element 30.

The material of the insulating support member 70 may be nylon, polycarbonate (PC), etc., or other insulating materials, which will not be repeated in the embodiment of the present application.

Illustratively, each first heat sink 20 can be provided with two insulating supports 70 correspondingly, and the two insulating supports 70 can be arranged on the main board 10 at intervals, and the two insulating supports 70 can position the first heat sink 20, the positional accuracy of the first heat sink 20 can be further improved.

Illustratively, there may be a plurality of assembly modules 90 formed by the first heat sink 20, the power element 30, the insulating thermally conductive layer 40 and the fixture 50, and the plurality of assembly modules 90 include a plurality of power elements 30. During the assembly process of the power element assembly structure of the embodiment of the present application, the plurality of assembly modules 90 may be sequentially assembled on the main board 10 respectively. Compared with the prior art in which a plurality of power elements are assembled on the heat sink, and then the plurality of power elements are plugged onto the main board at the same time, the assembly modules 90 in the power element assembly structure of the embodiment of the present application is smaller in size, which can reduce the difficulty of alignment between the pins of the plurality of power elements 30 and the socket holes of the main board 10. Moreover, a tolerance of the socket hole on the main board 10 can be reduced, which improves the position accuracy between the power element 30 and the main board 10.

Figure 3:
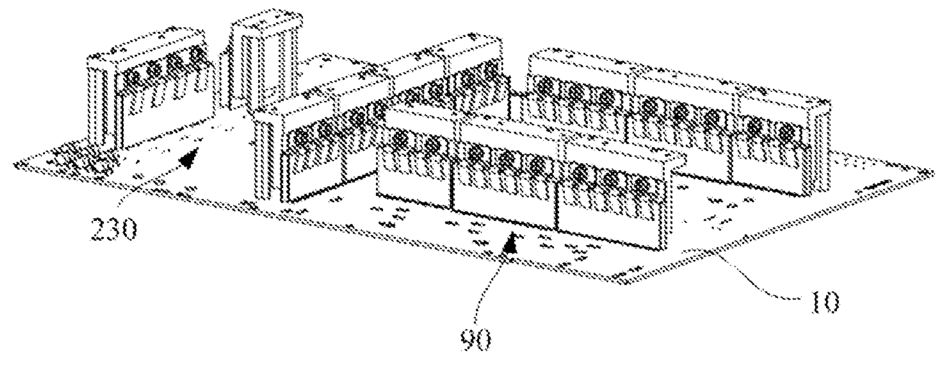
FIG. 3 is a schematic diagram of the power component assembly structure in FIG. 1 when a second heat sink is hidden.

Referring to FIGS. 1 to 3, when there are a plurality of assembly modules 90, the power element assembly structure includes a plurality of first heat sinks 20. Part or all of the first heat sinks 20 in the power element assembly structure can be surrounded to form a heat dissipation channel 230. The heat dissipation channel 230 is used for flowing of heat dissipation airflow. Illustratively, a heat dissipation fan may be provided at a position opposite to the dissipation channel 230. The heat dissipation airflow blown by the heat dissipation fan can flow in the heat dissipation channel 230, to sequentially dissipate heat from the plurality of first heat sinks 20 which form the heat dissipation channel 230, thereby improving the heat dissipation effect of the power element 30.

The power element assembly structure may further include a second heat sink 80, where the second heat sink 80 is connected to the top surface 213 of the first heat sink 20. The heat generated by the power element 30 during operation can be transferred to the first heat sink 20 through the insulating thermally conductive layer 40, and then transferred to the second heat sink 80 for heat dissipation. The second heat sink 80 can increase an area for heat dissipation for the power element 30, to enhance the heat dissipation effect, to further prevent heat from damaging the power element 30, which improves reliability of the power element 30. Illustratively, the second heat sink 80 is connected to the first heat sink plate 210 of the first heat sink 20, and the first heat sink plate 210 has a larger area, which increases the contact area between the first heat sink 20 and the second heat sink 80, thereby improving the heat dissipation effect of the power element 30.

In addition, because the second heat sink 80 is connected to the top surface 213 of the first heat sink 20, that is, the second heat sink 80 is connected to a side of the first heat sink 20 facing away from the main board 10, disassembly between the second heat sink 80 and the first heat sink 20 is more convenient, thus improving replaceability of the second heat sink 80. Illustratively, the second heat sink 80 may be a water-cooled heat sink, an air-cooled heat sink, or a self-cooled heat sink.

Illustratively, when there are a plurality of assembly modules 90, there are a plurality of first heat sinks 20, and the top surfaces of the plurality of first heat sinks 20 are aligned. Before the second heat sink 80 is installed on the top surface 213 of the first heat sink 20, the position of the top surfaces 213 of the plurality of first heat sinks 20 can be adjusted using an adjusting jig, to make the top surfaces of the plurality of first heat sinks aligned.

For example, the top surface 213 of the first heat sink 20 is a plane, a mounting surface of the second heat sink 80 is also a plane, and the adjusting jig is provided with an adjusting plane. After a plurality of first heat sinks 20 are sequentially sleeved on the connecting protrusions 710 of the insulating support columns, and the pins of the power elements 30 are plugged on the main board 10, the adjusting plane of the adjusting jig can be abutted against the top surface 213 of the first heat sink 20, and then, the adjusting jig, the main board 10 and the assembly module 90 connected to the main board 10 are turned upside down. Under the action of gravity, the first heat sink 20 slides in the direction of the adjusting jig on the connecting protrusion 710 until the top surfaces 213 of the plurality of first heat sink 20 are in full contact with the adjusting plane of the adjusting jig, so that the top surfaces 213 of the first heat sinks 20 are located in the same plane. The pins of the power element 30 are then welded to the main board 10, and at the same time, the position between the first heat sink 20 and the main board 10 is fixed. When the second heat sink 80 is connected to the top surface 213 of the first heat sink 20, the mounting surface of the second heat sink 80 can be in contact with the top surfaces 213 of the first heat sinks 20, to make the second heat sink 80 dissipate heat from the plurality of power elements 30, thereby ensuring the heat dissipation effect of the power elements 30.

In addition, in the process of assembling the power element assembly structure, after the pins of the power element 30 are welded to the main board 10, it is usually necessary to test at least part of the functional circuit formed by the main board 10 and the power element 30. The top surface 213 of the first heat sink 20 can support the main board 10 and the assembly module 90 connected to the main board 10, thereby improving the stability of the main board 10 and the assembly module 90 connected to the main board 10, and improving the accuracy of the test result.

Illustratively, a thermal conductive material may be arranged between the first heat sink 20 and the second heat sink 80. The thermally conductive material can make the contact between the first heat sink 20 and the second heat sink 80 closer, to ensure that heat transfer from the first heat sink 20 to the second heat sink 80, thereby ensuring the heat dissipation effect of the power element 30.

The thermally conductive material may also be arranged between the insulating thermally conductive layer 40 and the first heat sink 20. The thermally conductive material can make the contact between the insulating thermally conductive layer 40 and the first heat sink 20 closer, thereby ensuring that heat transfer from the insulating thermally conductive layer 40 to the first heat sink 20, thereby ensuring the heat dissipation effect of the power element 30.

Illustratively, the thermally conductive material may include at least one of a thermal washer and thermal grease.

In order to facilitate the understanding of the technical solution of the embodiments of the present application, the assembly process of the power element assembly structure will be described in detail below.

Firstly, a main board 10 is provided. Illustratively, a main circuit may be arranged in the main board 10. The main board 10 may be provided with a socket hole configured to connect with the power element 30, and a third screw hole 110 configured to connect with the insulating support 70.

Secondly, the power element 30 and the insulating thermally conductive layer 40 are fixed on the lateral surface 221 of the first heat sink by the fixture 50 to form the assembly module 90. Illustratively, referring to FIG. 4 and FIG. 5, the insulating thermally conductive layer 40, the power element 30 and the insulating sheet 60 can be placed on the lateral surface 221 of the first heat sink 20 in sequence, to make the second through hole 610 of the insulating sheet 60 and the second screw hole 222 on the lateral surface 221 opposite to each other. The fixture 50 is placed on the insulating sheet 60 to make the crimping portion 530 of the fixture 50 located on a region on the insulating sheet 60 corresponding to the power element 30, and make the first through hole 511 of the first connecting portion 510 of the fixture 50 and the first through hole 511 of the insulating sheet 60 of the second through holes 610 opposite to each other. The connecting bolt is sequentially passed through the first through hole 511 and the second through hole 610, and is screwed into the second screw hole 222, so that the crimping portion 530 of the fixture 50 crimps the insulating sheet 60, the power element 30 and the insulating thermally conductive layer 40 on the lateral surface 221 of the first heat sink 20, to form the assembly module 90. Illustratively, there may be a plurality of assembly modules 90, and the plurality of assembly modules 90 may be assembled in advance.

Then, the first end of the insulating support 70 is connected to the main board 10, the assembly module 90 is connected to the second end of the insulating support 70, to make the pin of the power element 30 be plugged on the main board 10. Illustratively, the first end of the insulating support column can be connected to the third screw hole 110 of the main board 10. The second end of the insulating support column is provided with a connecting protrusion 710. Then, the third through hole 211 of the first heat sink 20 in the assembly module 90 is sleeved on the connecting protrusion 710, and the pin of the power element 30 are plugged into the socket hole of the main board 10. When there are a plurality of assembly modules 90, the above process is repeated, the plurality of assembly modules 90 are connected to the second end of the insulating support 70, and the pins of the power elements 30 in the plurality of assembly modules 90 are plugged on the main board 10.

After the assembly module 90 is connected to the second end of the insulating support 70 and the pins of the power elements 30 are plugged on the main board 10, the position of the assembly module 90 can be adjusted by using the adjusting jig. Illustratively, after a plurality of first heat sinks 20 are sequentially sleeved on the connection protrusion 710 of the insulating support column, and the pins of the power elements 30 are plugged on the main board 10, the adjusting plane of the adjusting jig can be abutted against the top surface 213 of the first heat sink 20. The adjusting jig, the main board 10 and the assembly module 90 connected to the main board 10 are turned upside down. Under the action of gravity, the first heat sink 20 slides in the direction of the adjusting jig on the connecting protrusion 710 until the top surfaces 213 of the plurality of first heat sink 20 are in full contact with the adjusting plane of the adjusting jig, so that the top surfaces 213 of the first heat sinks 20 are located in the same plane. The pins of the power element 30 are welded to the main board 10, to form at least part of the functional circuit, and at the same time, the position between the first heat sink 20 and the main board 10 is fixed.

After the pins of the power element 30 are welded to the main board 10 to form at least part of the functional circuit, at least part of the functional circuit can be tested. At this time, the top surface 213 of the first heat sink 20 can be placed on a plane, to support other components, such as the power element 30 and the main board 10.

The second heat sink 80 is connected to the top surface 213 of the first heat sink 20. Illustratively, after the at least part of the functional circuit is tested, the main board 10 and the assembly module 90 connected to the main board 10 may be turned upside down, so that the top surface 213 of the first heat sink 20 faces down. The top surface 213 of the first heat sink 20 is coated with thermally conductive material, and then the mounting surface of the second heat sink 80 is abutted against the thermally conductive material, and the second heat sink 80 and the first heat sink 20 are connected. Illustratively, the second heat sink 80 may be a water-cooled heat sink, an air-cooled heat sink, or a self-cooled heat sink.

Finally, it should be noted that the above embodiments are only used to illustrate the technical solutions of the application, but not to limit it; although the present application has been described in detail with reference to the foregoing embodiments, those skilled in the art should understand that, they can make modifications to the technical solutions described in the foregoing embodiments, or equivalently replace some or all of the technical features; and these modifications or replacements do not cause the essence of the corresponding technical solutions to deviate from the scope of technical solutions of the embodiments of the present application.

What is claimed is:

1. A power element assembly structure, comprising: a main board, a first heat sink, a second heat sink, an insulating support, a power element, an insulating thermally conductive layer, and a fixture;

wherein a first end of the insulating support is connected to the main board, a second end of the insulating support is connected to a bottom surface of the first heat sink, and there is a distance between the first heat sink and the main board, a top surface of the first heat sink is connected to the second heat sink; and the insulating thermally conductive layer is attached to a lateral surface of the first heat sink, the power element is attached to the insulating thermally conductive layer, and is fixed to the first heat sink by the fixture, and the power element is plugged into the main board;

wherein the insulating support is an insulating support column, a first end of the insulating support column is connected to the main board, and a second end of the insulating support column is provided with a connecting protrusion; the first heat sink is provided with a third through hole, and the third through hole is sleeved on the connecting protrusion.

2. The power element assembly structure according to claim 1, wherein the fixture is an elastic sheet, the elastic sheet is connected to the first heat sink, and the power element is crimped to the lateral surface of the first heat sink.

3. The power element assembly structure according to claim 2, wherein the power element assembly structure further comprises an insulating sheet, the insulating sheet is located between the fixture and the power element, and the insulating sheet is crimped on the power element by the fixture.

4. The power element assembly structure according to claim 3, wherein a screw hole is provided on the lateral surface of the first heat sink;

both the fixture and the insulating sheet have through holes, and the fixture and the insulating sheet are connected to the first heat sink through a connecting bolt passing through the through holes.

5. The power element assembly structure according to claim 3, wherein two protecting portions are respectively provided on both sides of the insulating sheet, both of the two protecting portions are connected to the insulating sheet, the two protecting portions and the insulating sheet are surrounded to form a protecting cavity, wherein the protecting cavity is provided on the power element.

6. The power element assembly structure according to claim 1, wherein a thermal conductive material is arranged between the first heat sink and the second heat sink; the thermal conductive material is also arranged between the insulating thermally conductive layer and the first heat sink.

7. The power element assembly structure according to claim 1, wherein the power element assembly structure comprises a plurality of the first heat sinks, and part or all of the first heat sinks in the power element assembly structure are surrounded to form a heat dissipation channel.

8. The power element assembly structure according to claim 7, wherein top surfaces of the plurality of first heat sinks are aligned.

* * * * *